United States Patent
Aube et al.

(10) Patent No.: US 7,332,927 B2
(45) Date of Patent: Feb. 19, 2008

(54) APPARATUS FOR TEMPORARY THERMAL COUPLING OF AN ELECTRONIC DEVICE TO A HEAT SINK DURING TEST

(75) Inventors: Paul J. Aube, Charlotte, VT (US); Normand Cote, Quebec (CA); Roger G. Gamache, Jr., Essex Junction, VT (US); David L. Gardell, Fairfax, VT (US); Paul M. Gaschke, Wappingers Falls, NY (US); Marc D. Knox, Hinesburg, VT (US); Denis D. Turcotte, Quebec (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/743,899

(22) Filed: May 3, 2007

(65) Prior Publication Data

US 2007/0285116 A1   Dec. 13, 2007

Related U.S. Application Data

(62) Division of application No. 10/906,483, filed on Feb. 22, 2005, now Pat. No. 7,259,580.

(51) Int. Cl.
G01R 31/26 (2006.01)
(52) U.S. Cl. .................................. 324/765; 324/158.1
(58) Field of Classification Search .................. None
See application file for complete search history.

(56) References Cited

U.S. PATENT DOCUMENTS

| | | | |
|---|---|---|---|
| 3,920,572 A | 11/1975 | King et al. | |
| 3,958,624 A | 5/1976 | Peeler et al. | |
| 4,239,638 A | 12/1980 | Beretta et al. | |
| 4,323,533 A | 4/1982 | Bramhall | |
| 4,507,274 A | 3/1985 | Broecker et al. | |
| 4,548,857 A | 10/1985 | Galante | |
| 4,567,505 A | 1/1986 | Pease et al. | |
| 5,053,434 A | 10/1991 | Chapman | |
| 5,170,930 A | 12/1992 | Dolbear et al. | |
| 5,864,176 A | 1/1999 | Babcock et al. | |
| 5,918,665 A | 7/1999 | Babcock et al. | |
| 6,624,224 B1 | 9/2003 | Misra | |
| 7,038,065 B2 | 5/2006 | Franz et al. | |
| 2003/0203188 A1 | 10/2003 | Bunyan | |

Primary Examiner—Paresh Patel
(74) Attorney, Agent, or Firm—Schmeiser, Olsen & Watts; Anthony J. Canale (57) ABSTRACT

A method, system and apparatus for testing an integrated circuit chip. The system including: means for forming a liquid polyalphaolefine layer on a bottom surface of the integrated circuit chip, a top surface of the integrated circuit chip having and a bottom surface not having signal and power pads; means for placing a surface of a heat sink into physical contact with the bottom surface of the polyalphaolefine layer; means for electrically coupling the integrated circuit chip to a tester; means for electrically testing the integrated circuit chip; means for electrically de-coupling the integrated circuit chip from the tester; means for removing the heat sink from contact with the polyalphaolefine layer, all or a portion of the polyalphaolefine layer remaining on the bottom surface of the integrated circuit chip; and means for removing the polyalphaolefine layer from the bottom surface of the integrated circuit chip.

20 Claims, 7 Drawing Sheets

APPARATUS FOR TEMPORARY THERMAL COUPLING OF AN ELECTRONIC DEVICE TO A HEAT SINK DURING TEST

This application is a divisional of Ser. No. 10/906,483 filed on Feb. 22, 2005.

FIELD OF THE INVENTION

The present invention relates to the field of integrated circuit chip testing; more specifically, it relates to a method and an apparatus for temporary thermal coupling of an integrated circuit chip to a heat sink during testing of the integrated circuit.

BACKGROUND OF THE INVENTION

As the transistor density and size of high performance integrated circuits, such as microprocessors increases, power usage and attendant heat generation increase as well. This becomes a significant problem during test of the integrated circuit chip, as the integrated circuit must be cooled to avoid thermally induced test result errors or even integrated circuit chip failures. Testing is often performed with the integrated circuit chip temporarily mounted on a test substrate. Increasingly, conventional cooling employed during test is insufficient to maintain the integrated circuit chip at a precise temperature. Therefore, there is a need for an efficient method and apparatus for thermally coupling an integrated circuit chip under test to a heat sink.

SUMMARY OF THE INVENTION

A first aspect of the present invention is a system for testing an integrated circuit chip, comprising: means for forming a liquid polyalphaolefine layer on a bottom surface of the integrated circuit chip, a top surface of the integrated circuit chip having signal and power pads and the bottom surface of the integrated circuit having no signal or power pads; means for placing a surface of a heat sink into physical contact with the bottom surface of the polyalphaolefine layer; means for electrically coupling the integrated circuit chip to a tester; means for electrically testing the integrated circuit chip; means for electrically de-coupling the integrated circuit chip from the tester; means for removing the heat sink from contact with the polyalphaolefine layer, all or a portion of the polyalphaolefine layer remaining on the bottom surface of the integrated circuit chip; and means for removing the polyalphaolefine layer from the bottom surface of the integrated circuit chip.

A second aspect of the present invention is an apparatus for testing integrated circuit chips at a test temperature, comprising: means for loading and unloading substrates from and to substrate carriers, electrically conductive signal and power pads on top surfaces of the integrated circuit chips electronically connected to respective the substrates; means for applying polyalphaolefine layers to bottom surfaces of the integrated circuit chips; means for loading and unloading the substrates from and to burn-in boards and for loading and unloading burn-in boards loaded with the substrates from and to one or more test racks; means for removing the polyalphaolefine layers from the bottom surfaces of the integrated circuit chips; means for moving the substrates between the means for loading and unloading substrates from and to the substrate carriers, the means for applying the polyalphaolefine layers, means for loading and unloading the substrates from and to the burn-in boards and the means for removing the polyalphaolefine layers from the bottom surfaces of the integrated circuit chips; means for supplying cooling fluid to heats sinks mounted on the test rack; means for bringing top surfaces of the heat sinks into physical contact with the polyalphaolefine layers; and means for testing electrical function of the integrated circuit chips.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Integrated circuit chips need to be tested not only for yield but also for reliability. Yield testing and reliability testing differ in two ways. First yield testing is often, but not exclusively, performed on individual integrated circuit chips while reliability testing is often, but not exclusively, performed on multiple integrated circuit chips at the same time. Second, yield-testing time is measured in seconds or minutes while reliability testing generally takes hours or days. While both types of testing may be performed at room temperature (i.e. about 24° C.) or at elevated temperatures (i.e. above room temperature), for yield testing elevated temperature testing is used to assure compliance to integrated circuit chip temperature specifications while for reliability testing, elevated temperature testing is used to accelerate potential failure rates. Both types of testing can generate large amounts of heat that need to be dissipated. In both types of testing the integrated circuit chip temperature needs to be precisely controlled in order to ensure accurate test results. In one example, burn-in testing is performed with the integrated circuit chip at a temperature of about 80° C. or greater. In a second example, the burn-in testing is performed with the integrated circuit chip at a temperature of about 140° C. or greater.

Since reliability testing, and a particular type of reliability testing called burn-in generally presents the more severe temperature and heat dissipation problems, the present invention will be described in terms of burn-in testing with the individual integrated circuit chips mounted on substrates. However, the present invention is applicable to all types of integrated circuit chip testing where thermal cooling of the integrated circuit chip is required.

Reliability stressing and testing (also referred to as Burn-In) is typically performed on a wide variety of integrated circuit chip package and carrier types. The package and/or carrier type are typically dependent on the manufacturing process flow or the end use requirements. Since worst-case chip powers are often experienced on high-end microprocessors, a typical high power server class microprocessor package will be used to illustrate the present invention. While this is a single example, the present invention is applicable to various other multiple package types such as, lidded packages, encapsulated packages, few chip module packages and multi chip module packages. The present invention is also applicable to various types and constructions of integrated circuit chip carriers or substrates.

Figure 1:
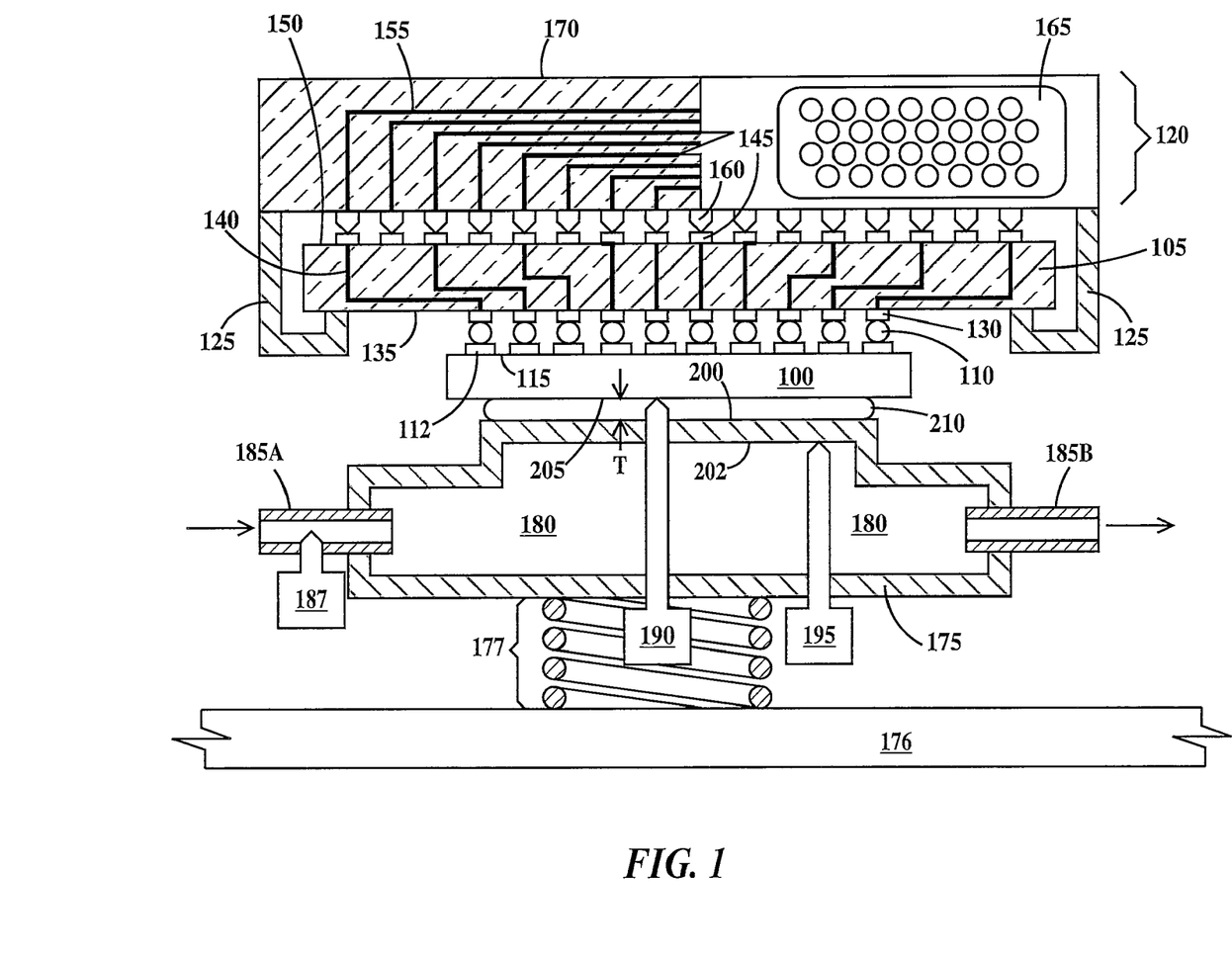
FIG. 1 is a cross-sectional view of a test fixture for practicing the present invention.
Figure 2:
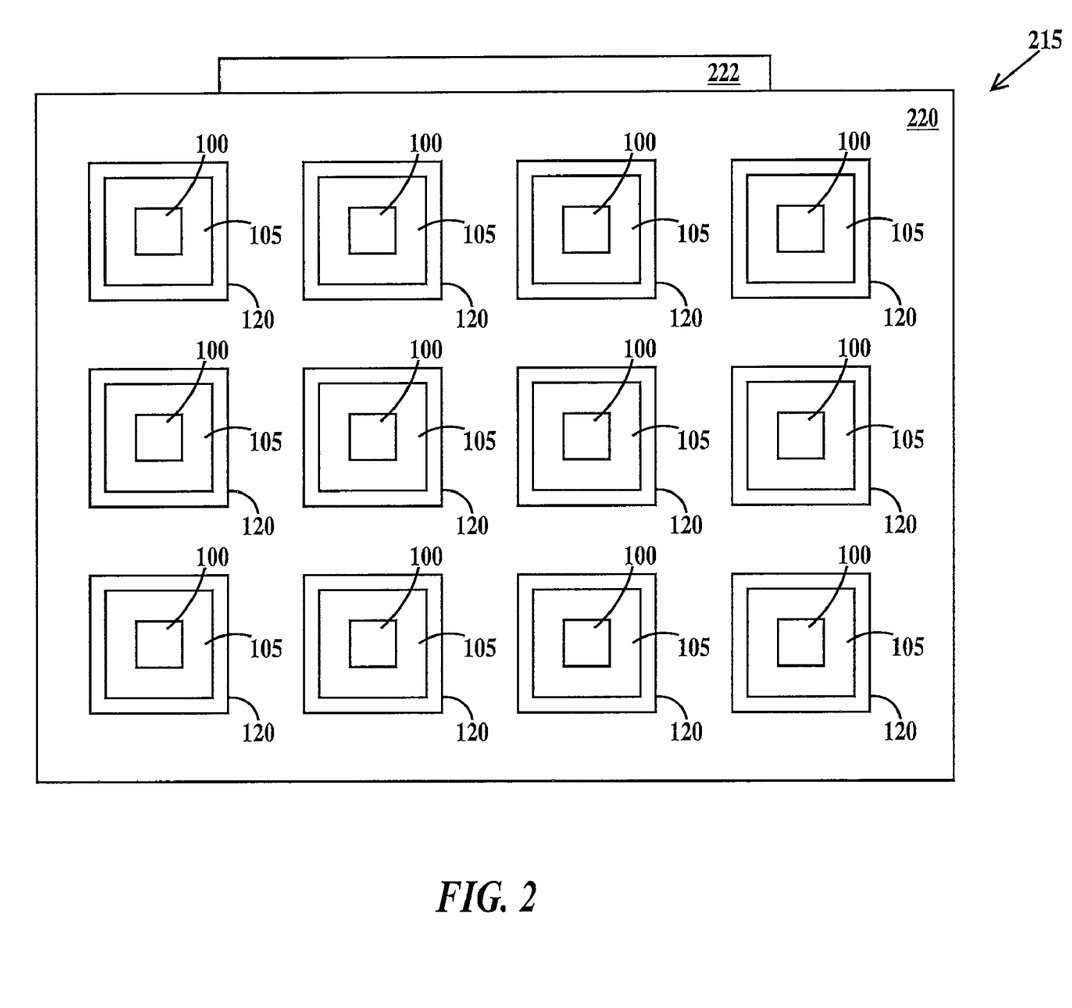
FIG. 2 is a schematic top view of a burn-in board 215 for practicing the present invention.

FIG. 1 is a cross-sectional view of a test fixture for practicing the present invention. In FIG. 1, an integrated circuit chip 100 is either temporarily or permanently mounted and electrically connected to a substrate 105 by a multiplicity of solder balls 110 on signal and power pads 112 on a top surface 115 of the integrated circuit chip. This type of connection is also called a controlled collapse chip connection (C4) or a flip-chip connection. Substrate 105 may be a temporary substrate or a permanent substrate. Substrate 105 is inserted into a socket 120 and secured in the socket by clips 125. Circuits (not shown) in integrated circuit chip 100 are electrically connected to pads 112 and then through solder balls 110 to frontside pads 130 on a top surface 135 of substrate 105. Wires 140 within substrate 105 are electrically connected to backside pads 145 on a bottom surface 150 of substrate 105. Backside pads 145 are electrically connected to wires 155 within socket 120 by contacts 160. Wires 155 are electrically connected to a multi-wire plug 165. Multi-wire plug 165 may be connected to a tester for supplying power and signals or to burn-in board as illustrated in FIG. 2 and described infra. Alternatively, wires 155 could be electrically connected to pins extending from a bottom surface 170 of socket 120 and the pins plugged into a cable connected to the testers or the pins soldered to vias a burn in board which in turn is connected to the tester or burn-in board or surface mounted (soldered) to pads on the surface of the burn in board.

Also illustrated in FIG. 1, is a heat sink 175. Heat sink 175 is permanently mounted on a heat sink fixture array plate 176 in a burn-in chamber (see FIG. 3 and description infra) by way of a spring 177. Heat sink 175 includes a cavity 180. A cooling fluid may be circulated from an inlet 185A, through cavity 180 and out an outlet 185B in order to cool heat sink 175. To control the temperature of integrated circuit chip 100, a first, second and third temperature sensors 187, 190 and 195 are provided. First temperature sensor 187 measures the temperature of the cooling fluid entering heat sink 175. Second temperature sensor 190, extending past a top surface 200 of the heat sink and contacting a bottom surface 205 of integrated circuit chip 100 measures the temperature of integrated circuit chip 100. Third temperature sensor 195 contacting an upper inside surface 202 of heat sink 175 measures the temperature of the heat sink itself.

A mechanism (not shown) in the burn-in chamber presses heat sink fixture array plate 176 toward integrated circuit chip 100. A heat transfer layer 210 (previously applied to bottom surface 205 of integrated circuit chip 100) of thermally conductive and electrically non-conductive material is thus forced into intimate contact with top surface 200 of heat sink 175 and bottom surface 205 of integrated circuit chip 100. Heat transfer layer 210 provides a temporary thermal coupling of integrated circuit 100 to heat sink 175. The composition and properties of heat transfer layer 210 are described infra.

Spring 177 assures heat sink 175 will be in intimate contact with some areas of the integrated circuit chip 205. The exact points of contact and the thickness T of the heat transfer layer 210 will be defined by the flatness of both integrated circuit chip 100 and top surface 200 of heat sink 175. In one example, top surface 200 of heat sink 175 is machined to a flatness of less than about 1 micron and the flatness integrated circuit chip 100 is about 3 microns or less depending on the residual stress within integrated circuit chip 100 from the manufacturing process. The thickness T of heat transfer layer 210, thus ranges from about zero to about 3 microns.

Second temperature sensor 190 may also be spring loaded in order to prevent damage to integrated circuit chip 100, but still maintain physical contact with bottom surface 205 of the integrated circuit chip. Both second and third temperature sensors 190 and 195 may be used to control the temperature and flow rate of the cooling fluid circulated through cavity 180.

In an alternative embodiment, second temperature sensor 190, is replaced with a temperature sensor "built into" integrated circuit chip 100. Various types of on-chip temperature sensors are known to those skilled in the art.

In some applications, powering and operation of the integrated circuit generates the heat to be dissipated by the heat sinks. In other cases heat must be supplied by the burn-in chamber (acting as an oven) or by a heater (not shown) directly attached to heat sink 175 or by using a heating fluid instead of a cooling fluid. In either case, the heat sink maintains integrated circuit chip 100 at a precise test temperature.

FIG. 2 is a schematic top view of a burn-in board 215 for practicing the present invention. In FIG. 2, a burn-in board 215 includes a high temperature circuit board 220 and a multi-wire connector 222 for plugging the burn-in board into a corresponding connector in the burn-in chamber (see FIG. 3) of a test system for supplying power and test signals to be distributed to individual sockets 120 by wires (not shown) within the burn-in board. A multiplicity of sockets 120 are permanently mounted on circuit board 215. Each socket 120 is illustrated containing a substrate 105 and an integrated circuit chip 100.

Figure 3:
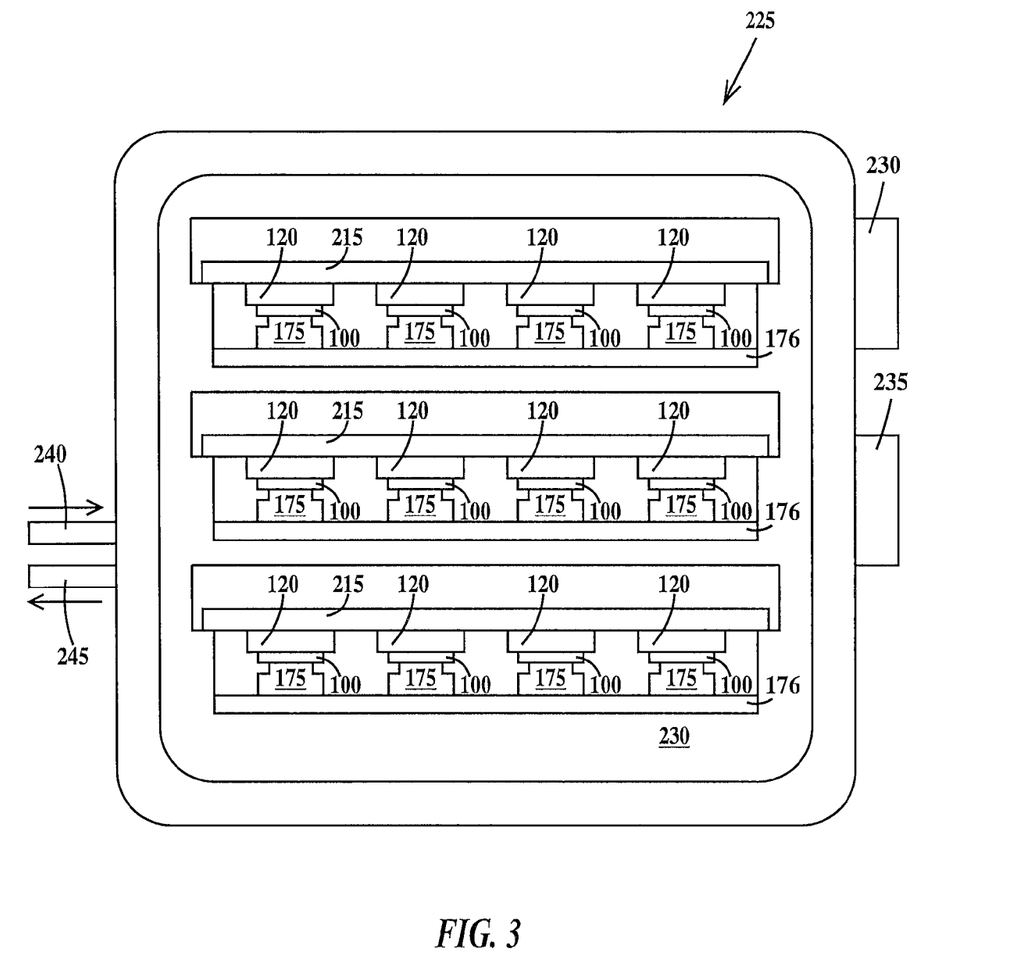
FIG. 3 is a schematic front view of a burn-in chamber 225 for practicing the present invention.

FIG. 3 is a schematic front view of a burn-in chamber 225 for practicing the present invention. In FIG. 3, a burn-in chamber 225 includes multiple heat sink fixture array plates 176, a multiplicity of heat sinks 175 and a rack 230. Multiple burn in boards 215, each having multiple sockets holding integrated circuit chips 100, are removably mounted in rack 230. Burn-in chamber 225 includes a power cable connector 230 and a test cable connector 235 for supplying power and test signals from a tester (not shown) to connectors (not shown) in rack 230 into which burn-in boards 225 are plugged. Burn-in chamber 225 also includes a cooling fluid inlet 240 and a cooling fluid outlet 245 for supplying cooling fluid from a cooling unit (not shown) to each heat sink 175. Heat-sinks 175 are permanently but moveably mounted to a heat sink fixture array plate 176, which is movably mounted to rack 230.

In a first alternate embodiment, each heat sink 175 is attached to the lid of a corresponding burn in socket 120 (see FIG. 2) and closing the socket lid brings the heat sink in intimate contact with integrated circuit chip 100. In a second alternate embodiment, heat sink fixture arrays 176 and burn-in boards 215 can be mounted in alternate orientations.

For example, burn-in boards 215 and heat sink array plates 176 may be positioned vertically instead of horizontally (as illustrated in FIG. 3) or heat sink array plates 176 may be position on top of burn-in board 215 instead of the burin-in boards being positioned on top of the heat sink array plates.

As will be described infra, heat transfer layer 210 (see FIG. 1) is applied to integrated circuit chips 100 before they are mounted in burn-in boards 215 and removed after testing is complete. It is advantageous to apply the heat transfer material in a manner that results in a small volume of heat transfer material but results in no voids over the course of the burn in test in order to reduce costs.

Figures 4A, 4B, 4C:
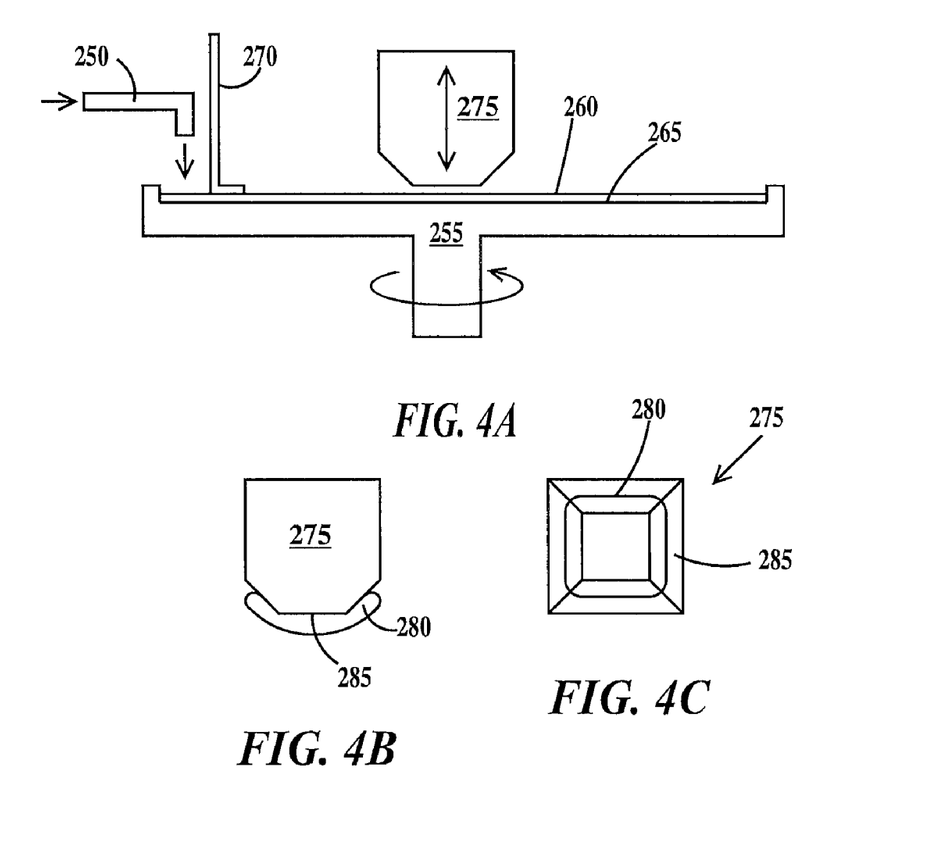
FIGS. 4A-4D illustrate a first method and apparatus for applying a heat transfer material to an integrated circuit chip to be tested according to the present invention.

FIGS. 4A-4D illustrate a first method and apparatus for applying a heat transfer material to an integrated circuit chip to be tested according to the present invention. In FIG. 4A, a dispensing nozzle 250 applies a heat transfer liquid onto a slowly rotating platen 255 to form a layer 260 of heat transfer liquid on a top surface 265 of platen 255. A weir 270, adjustable in a direction perpendicular to top surface 265 of platen 255 allows for control of the thickness of layer 260. A resilient stamp 275 free to travel in a direction perpendicular to top surface 265 of platen 255 is dipped into layer 260 and then removed and is thus wetted with heat transfer liquid as shown in FIG. 4B.

Figure 4D:
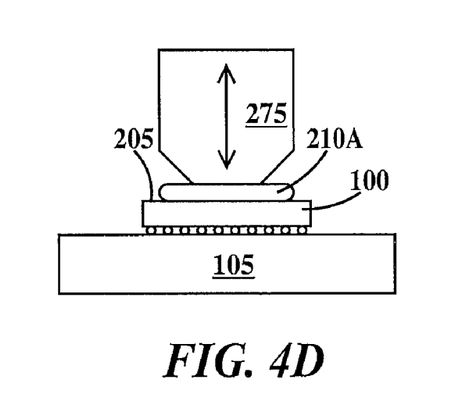
Figure 4E:
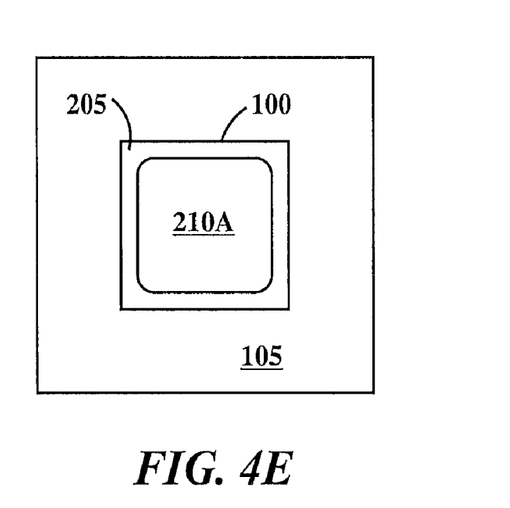
FIG. 4E is a top view of a substrate with a heat transfer layer applied.

In FIG. 4B, a layer 280 of heat transfer liquid is formed on a bottom surface 285 of stamp 275. FIG. 4C is a view of bottom surface 285 of stamp 275 showing surface 285 has the shape of a truncated pyramid. Layer 280 is also illustrated. In FIG. 4D, stamp 275 is pressed to and then released from bottom surface 205 of integrated circuit chip 100 thus transferring all or a portion of layer 280 (see FIG. 4B) to integrated circuit chip and forming a heat transfer layer 210A on bottom surface 205 of integrated circuit 100. FIG. 4E, is a top view of substrate 105 and integrated circuit chip 100 with heat transfer layer 210A applied. Heat transfer layer 210A will become heat transfer layer 210 when heat sink 175 is brought into contact with integrated circuit chip 100 prior to the start of testing (see FIG. 1). The volume of heat transfer liquid dispensed may be adjusted by weir 270 (see FIG. 4A) such that during testing no heat transfer liquid spills over the edges of the integrated circuit chip being tested.

Returning to FIG. 4A, a person of ordinary skill in the art will be able to construct a jig for moveably holding stamp 275 that may placed first over platen 255 to pick up the heat transfer liquid and then placed over substrate 105 (see FIG. 1) to transfer the picked up heat transfer liquid to integrated circuit chip 100 (see FIG. 4E).

Figure 5A:
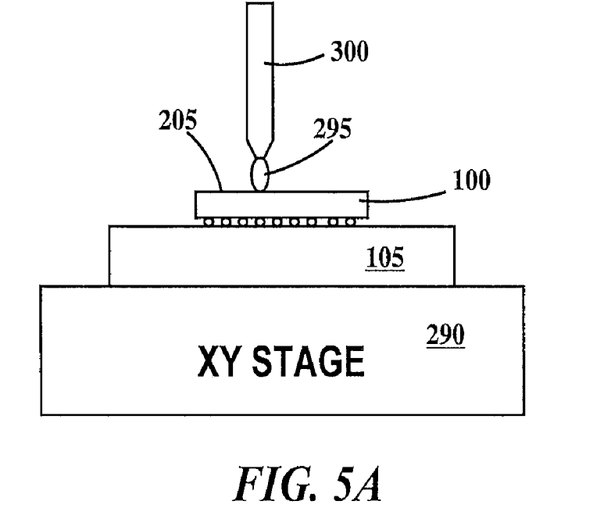
FIGS. 5A-5D illustrate a second method and apparatus for applying a heat transfer material to an integrated circuit chip to be tested according to the present invention.
Figure 5B:
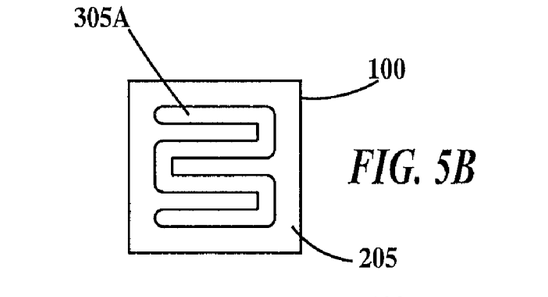
Figure 5C:
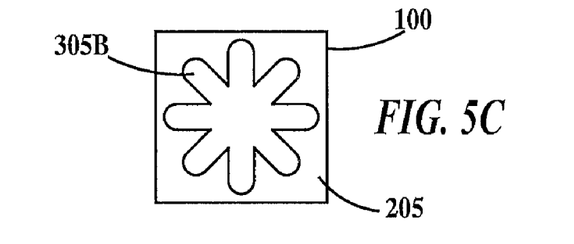
Figure 5D:
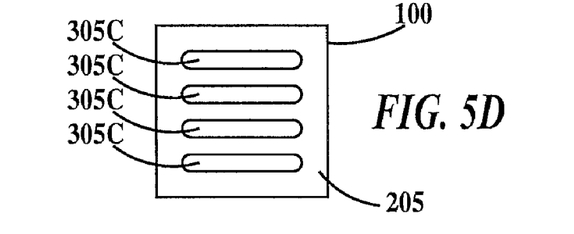

FIGS. 5A-5D illustrate a second method and apparatus for applying a heat transfer material to an integrated circuit chip to be tested according to the present invention. In FIG. 5A, substrate 105 coupled to integrated circuit chip 100 is temporarily held on an X-Y stage 290, while a stream 295 of heat transfer liquid is dispensed on bottom surface 205 of the integrated circuit chip. The heat transfer liquid may be dispensed in any number of patterns, three examples of which are illustrated in FIGS. 5B, 5C and 5D.

In FIG. 5B, a heat transfer layer 305A has the form of a serpentine. Heat transfer layer 305B become heat transfer layer 210 (see FIG. 1) when heat sink 175 is brought into contact with integrated circuit chip 100 during testing and heat transfer layer 305B is spread out by the contact to form heat transfer layer 210. Again, the volume of heat transfer liquid dispensed may be adjusted such that during testing no heat transfer liquid spills over the edges of the integrated circuit chip being tested.

In FIG. 5C, a heat transfer layer 305A has the form of a star. Heat transfer layer 305B become heat transfer layer 210 (see FIG. 1) when heat sink 175 is brought into contact with integrated circuit chip 100 during testing and heat transfer layer 305B is spread out by the contact to form heat transfer layer 210.

In FIG. 5D, a heat transfer layer 305C is in the form of a series of parallel bars. Heat transfer layer 305C become heat transfer layer 210 (see FIG. 1) when heat sink 175 is brought into contact with integrated circuit chip 100 during testing and heat transfer layer 305C is spread out by the contact to form heat transfer layer 210.

Other methods of dispensing a heat transfer material onto the bottom surface of an integrated circuit chip include rolling, brushing and spraying. Heat transfer liquid may include liquid, solid or gel materials dispersed or dissolved in a carrier liquid.

Figure 6:
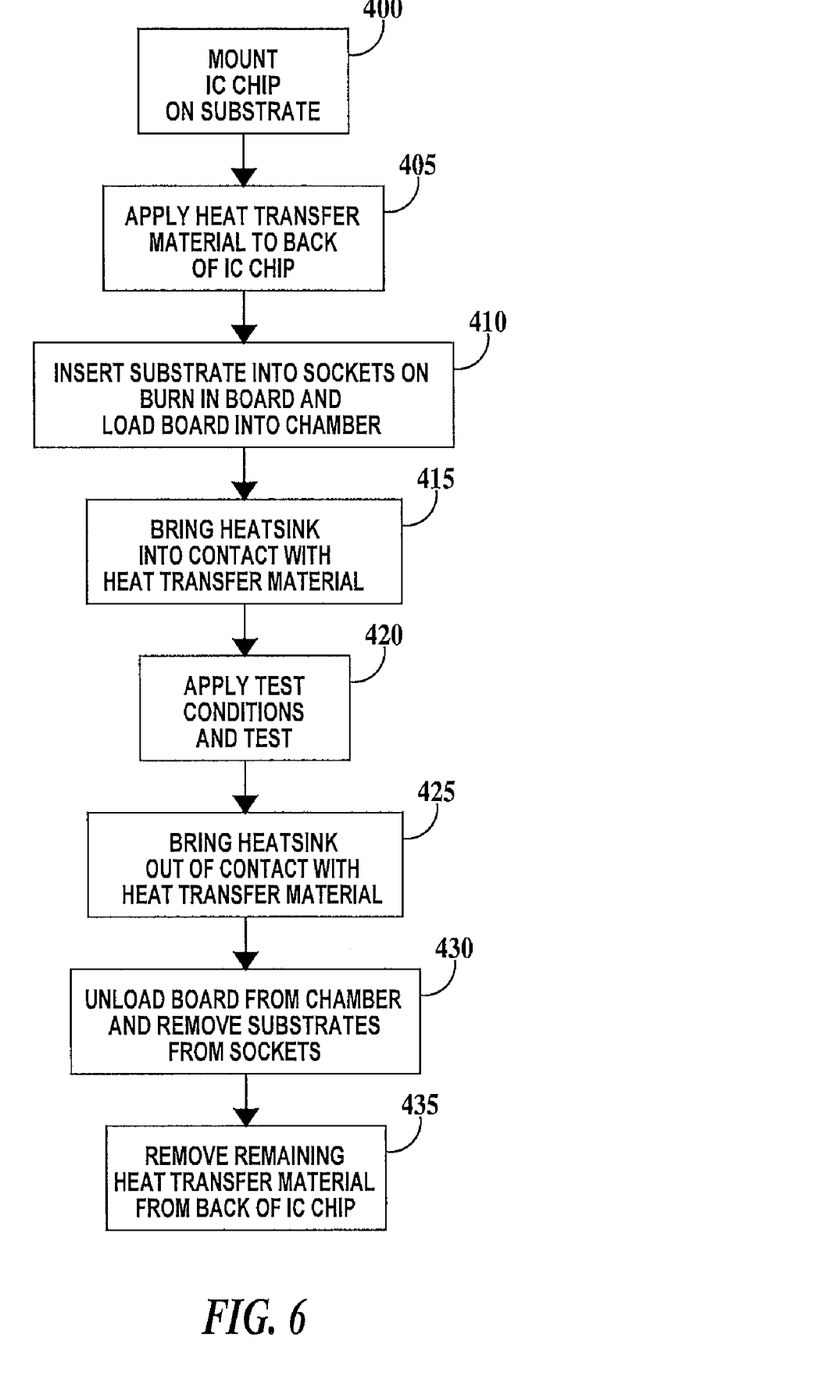
FIG. 6 is a flowchart of the method of testing an integrated circuit chip according to the present invention.

FIG. 6 is a flowchart of the method of testing an integrated circuit chip according to the present invention. In step 400, an integrated circuit chip is flip-chip mounted on a substrate. The substrate may be a permanent customer shippable module or a temporary test substrate. In step 405, a temporary layer of heat transfer material is applied to the bottom surface of the integrated circuit chip using any of the techniques described supra, or other techniques known in the art.

The heat transfer material should be a thermal conductor, an electrical insulator, have a flash point above about 20° C. above the burn-in or test temperature, have a low volatility (i.e. a vaporization or boiling temperature above about 20° C. above the burn-in or test temperature), be non-reactive with the ambient atmosphere, the integrated circuit chip or the heat sink, not degrade or decompose over the time the integrated circuit chip is at test temperature and be easily removed. The heat transfer material, in the case of a liquid, should have a viscosity high enough to allow controlled coating of the back surface of the integrated circuit chip without running over the edges of the integrated circuit chip but low enough to allow intimate contact of the integrated circuit chip and the heat sink over the range of spring force and burn-in temperatures expected.

In a first example, four classes of materials that may be used as heat transfer materials include synthetic inorganic oils, natural inorganic oils, synthetic organic oils and natural organic oils. In a second example, a particular class of oils that may be used as heat transfer materials are polyalphaolefines (PAOs). In a third example, a particular PAO material that may be used as heat transfer material is hydrogenated 1-decence homopolymer available under the name of Synton PAO 40; 100 manufactured by Daychem Labortories, Vandalia, Ohio. Synton PAO 40;100 was selected as a superior heat transfer material for the purposes of the present invention after exhaustive testing of many materials.

In step 410, the substrates are inserted into sockets on a burn-in board and the burn-in board is inserted into the burn-in chamber. In step 415, heat sinks in the burn-in chamber are brought into contact with the layer of heat transfer material on the individual integrated circuits in order to form heat transfer layer 210 (see FIG. 1). In step 420, burn-in test conditions (including raising the integrated circuit chip to burn-in temperature) are applied and the burn-in test performed as is well known in the art.

In step 425, the heat sinks are brought out of contact with the heat transfer material on individual integrated circuit chips. All or a portion of the heat transfer material remains on the back surface of the integrated circuit chips and a portion may remain on the heat sinks. In a first example, the heat transfer material is removed immediately or periodically from the heat sinks (e.g. by wiping with a clean dry cloth or solvent containing cloth) after testing just a single integrated circuit chip or after testing multiple integrated circuit chips. In a second example, the heat transfer material left on the heat sinks. In the second case it is helpful if the heat transfer material is chemically stable and non-volatile when exposed to burn-in temperatures for extended numbers of burn-in cycles.

In step 430, the burn-in boards are removed from the burn-in chamber and the substrates are removed from the burn-in boards.

In step 435, the heat transfer material is removed from the backside of the integrated circuit chips. In one example, wet cleaning is performed using one or more solvents that dissolve the heat transfer material. When the heat transfer material is a PAO, a suitable cleaning process includes one or more xylene spray cleaning followed by an isopropanol (IPA) spray cleaning, followed by a nitrogen spray dry. The method of the present invention is now complete.

Figure 7:
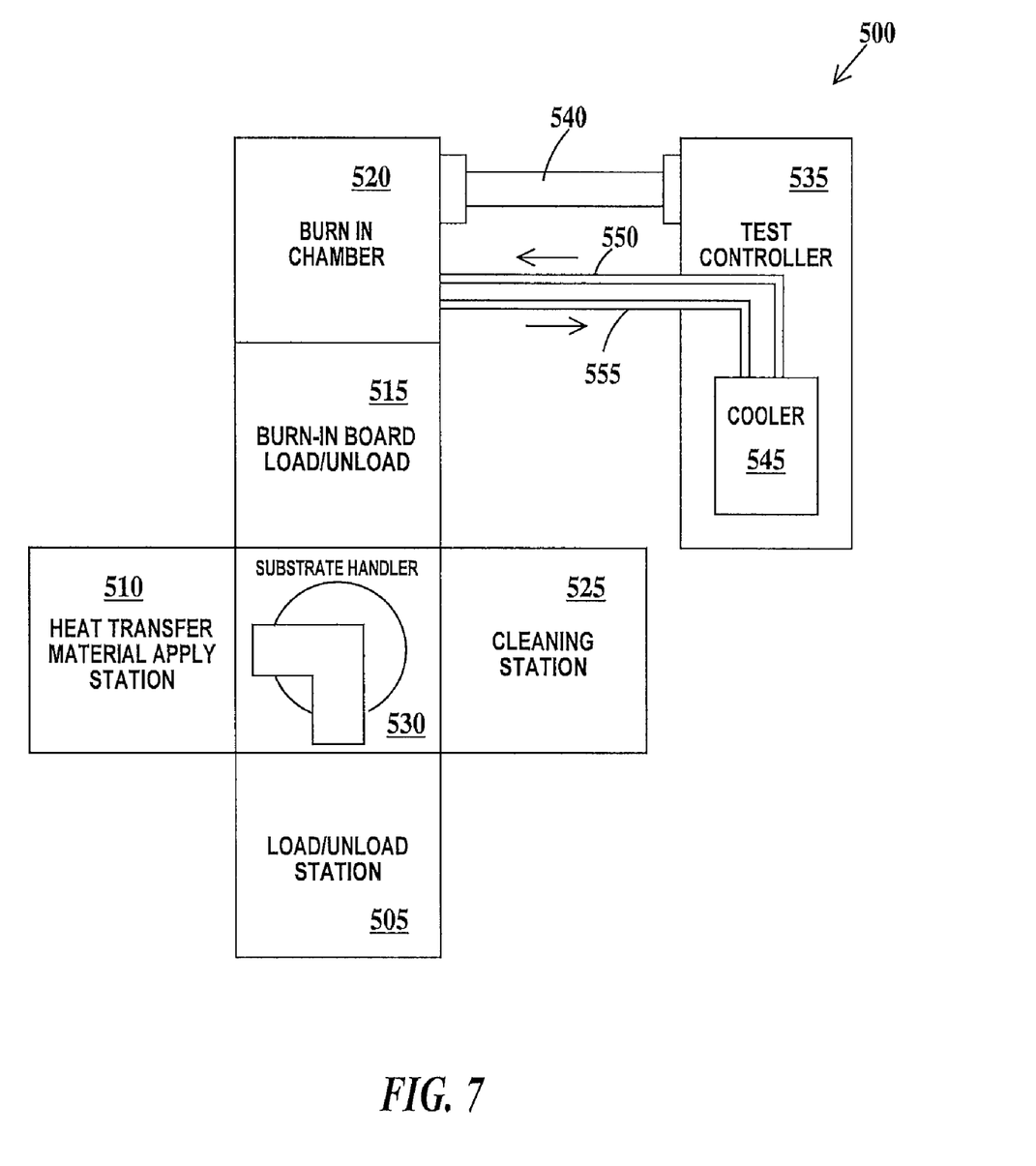
FIG. 7 is a top view schematic diagram of an automated tool for practicing the current invention.

FIG. 7 is a top view schematic diagram of an automated tool for practicing the current invention. In FIG. 7, a test system 500 includes a load/unload station 505 for loading and unloading substrates from/to substrate carriers, a heat transfer material apply station 510 for applying heat transfer material to the backside of integrated circuit chips by any of the techniques or other techniques described supra, a burn-in board load/unload station 515 for loading and unloading substrates from/to a burn-in board and loading and unloading burn-in boards from/to a burn-in chamber 520 in which testing is performed, a cleaning station 525 for removing heat transfer material from the back surface of integrated circuit chips, a substrate handler 530 for moving substrates between stations 505, 510, 515 and 525, and a test controller 535. Test controller 535 is connected to burn-in chamber 520 by a test signal/power cable 540. A cooling unit 545 within test or controller (or alternatively as a standalone unit) supplies cooling fluid to heats sinks within burn-in chamber 520 by inlet tube 550 and outlet tube 555. Test system 500 economically feasible only when the heat transfer fluid used within the system is stable for many burn-in test cycles and does not contaminate the system with heat transfer material decomposition products, thus requiring less test system maintenance.

Thus, the present invention provides an efficient method and apparatus for thermally coupling an integrated circuit chip under test to a heat sink.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A system for testing an integrated circuit chip, comprising:

means for forming a liquid polyalphaolefine layer on a bottom surface of said integrated circuit chip, a top surface of said integrated circuit chip having signal and power pads and said bottom surface of said integrated circuit having no signal or power pads;

means for placing a surface of a heat sink into physical contact with said bottom surface of said polyalphaolefine layer;

means for electrically coupling said integrated circuit chip to a tester;

means for electrically testing said integrated circuit chip;

means for electrically de-coupling said integrated circuit chip from said tester;

means for removing said heat sink from contact with said polyalphaolefine layer, all or a portion of said polyalphaolefine layer remaining on said bottom surface of said integrated circuit chip; and means for removing said polyalphaolefine layer from said bottom surface of said integrated circuit chip.

2. The system of claim 1, further including:

means for electrically connecting said signal and power pads of said integrated circuit chip to a substrate; and means for inserting said substrate into an electrical socket on a burn-in board and coupling said burn-in board to a tester.

3. The system of claim 1, wherein said electrically testing said integrated circuit chip is performed at a temperature above room temperature.

4. The system of claim 1, wherein said electrically testing said integrated circuit chip is performed at a temperature of about 80° C. or higher.

5. The system claim 1, wherein said electrically testing said integrated circuit chip is performed at a temperature of about 140° C. or higher.

6. The system of claim 1, wherein said polyalphaolefine layer comprises hydrogenated 1-decence homopolymer.

7. The system of claim 1, wherein (i) said polyalphaolefine layer has a thickness after being placed into physical contact with said bottom surface of said integrated circuit chip of between about 0 microns and about 3 microns, said polyalphaolefine layer completely fills a gap between a bottom surface of said integrated circuit chip and a top surface of said heat sink or (ii) said polyalphaolefine layer has a thickness after being placed into physical contact with said bottom surface of said integrated circuit chip of between about 0 microns and about 3 microns and said polyalphaolefine layer completely fills a gap between a bottom surface of said integrated circuit chip and a top surface of said heat sink.

8. The system of claim 1, further including:

means for controlling circulation of a cooling fluid through said heat sink in order to control a temperature said integrated circuit chip.

9. The system of claim 1, wherein said means for forming said polyalphaolefine layer includes means for dispensing said liquid polyalphaolefine in a serpentine pattern, a star patter or a set of parallel bars in order to prevent spillage of said polyalphaolefine onto sides of said integrated circuit chip.

10. The system of claim 1, wherein step said means for removing said polyalphaolefine layers includes rinsing said integrated circuit chips in an organic solvent.

11. An apparatus for testing integrated circuit chips at a test temperature, comprising:

means for loading and unloading substrates from and to substrate carriers, electrically conductive signal and power pads on top surfaces of said integrated circuit chips electronically connected to respective said substrates;

means for applying polyalphaolefine layers to bottom surfaces of said integrated circuit chips;

means for loading and unloading said substrates from and to burn-in boards and for loading and unloading burn-in boards loaded with said substrates from and to one or more test racks;

means for removing said polyalphaolefine layers from the bottom surfaces of said integrated circuit chips;

means for moving said substrates between said means for loading and unloading substrates from and to said substrate carriers, said means for applying said polyalphaolefine layers, means for loading and unloading said substrates from and to said burn-in boards and said means for removing said polyalphaolefine layers from said bottom surfaces of said integrated circuit chips;

means for supplying cooling fluid to heats sinks mounted on said test rack;

means for bringing top surfaces of said heat sinks into physical contact with said polyalphaolefine layers; and means for testing electrical function of said integrated circuit chips.

12. The apparatus of claim 11, wherein said test temperature is greater than room temperature.

13. The apparatus of claim 11, wherein said test temperature is about 80° C. or higher.

14. The apparatus of claim 11, wherein test temperature is about 140° C. or higher.

15. The apparatus of claim 11, wherein said polyalphaolefine layer comprises hydrogenated 1-decence homopolymer.

16. The apparatus of claim 11, wherein said polyalphaolefine layers have a thickness after being placed into physical contact with said bottom surface of said heat transfer layer of between about 0 microns and about 3 microns, said polyalphaolefine layer completely fills gaps between said bottom surfaces of said integrated circuits and atop surfaces of said heat sinks or said polyalphaolefine layers have a thickness after being placed into physical contact with said bottom surfaces of said heat sinks of between about 0 microns and about 3 microns and said polyalphaolefine layer completely fills a gap between said bottom surfaces of said integrated circuits and said top surfaces of said heat sinks.

17. The apparatus of claim 11, further including:

means for individually controlling circulation of said cooling fluid through each of said heat sinks in order to individually control temperatures of respective integrated circuit chips.

18. The apparatus of claim 11, wherein said means for applying said polyalphaolefine layer includes means for dispensing liquid polyalphaolefine a serpentine pattern, a star patter or a set of parallel bars in order to prevent spillage of said polyalphaolefine onto said of modules.

19. The apparatus of claim 11, wherein step said means for removing said polyalphaolefine layers includes rinsing said integrated circuit chips in an organic solvent.

20. The apparatus of claim 11, wherein said polyalphaolefine layer is thermally stable at a temperature of about 160° C. or greater.

* * * * *